United States Patent
Humphrey et al.

(10) Patent No.: US 9,883,606 B1
(45) Date of Patent: Jan. 30, 2018

(54) POWER SUPPLIES

(71) Applicant: HEWLETT PACKARD ENTERPRISE DEVELOPMENT LP, Houston, TX (US)

(72) Inventors: Daniel Humphrey, Houston, TX (US); Rameez Kadar Kazi, Houston, TX (US); Michael R. Miller, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/336,027

(22) Filed: Oct. 27, 2016

(51) Int. Cl.
*H05K 7/14* (2006.01)
*H05K 7/20* (2006.01)
*H01R 33/88* (2006.01)

(52) U.S. Cl.
CPC .......... *H05K 7/1492* (2013.01); *H01R 33/88* (2013.01); *H05K 7/20172* (2013.01); *H05K 7/20727* (2013.01); *H05K 7/20909* (2013.01)

(58) Field of Classification Search
None
See application file for complete search history.

(56) References Cited

U.S. PATENT DOCUMENTS

| | | | |
|---|---|---|---|
| 3,829,740 A | 8/1974 | Beasley | |
| 5,831,847 A * | 11/1998 | Love | H02M 3/00 361/695 |
| 5,926,367 A | 7/1999 | Gutierrez et al. | |
| 6,038,126 A * | 3/2000 | Weng | G06F 1/189 312/223.2 |
| 6,445,586 B1 * | 9/2002 | Chou | G06F 1/182 312/223.1 |
| 8,294,298 B2 | 10/2012 | Yang | |
| 8,848,362 B1 | 9/2014 | Che et al. | |
| 9,491,886 B1 * | 11/2016 | Parkinson | H05K 7/1487 |
| 2002/0173265 A1 * | 11/2002 | Kipka | H05K 9/0041 454/184 |
| 2005/0184605 A1 | 8/2005 | Vinson et al. | |
| 2006/0092599 A1 | 5/2006 | Yamamura et al. | |
| 2008/0309160 A1 * | 12/2008 | Gibson | H01R 31/02 307/11 |
| 2009/0172453 A1 * | 7/2009 | Dishman | G06F 1/263 713/340 |
| 2012/0069514 A1 * | 3/2012 | Ross | H05K 7/20727 361/679.33 |
| 2015/0271944 A1 * | 9/2015 | Ross | G06F 1/187 361/679.33 |

* cited by examiner

*Primary Examiner* — Dimary Lopez Cruz
*Assistant Examiner* — Zhengfu Feng

(57) ABSTRACT

In various examples, a system comprises a first plurality of power supplies comprising a first plurality of external electrical connectors, and a second plurality of power supplies comprising a second plurality of external electrical connectors. The first plurality of power supplies may be symmetric with the second plurality of power supply about an axis of symmetry. The system further comprises a common fan module. The common fan module comprises a fan to cool the first plurality of power supplies and the second plurality of power supplies, a power inlet, a third plurality of electrical connectors, a fourth plurality of electrical connectors. The third plurality of electrical connectors are capable of being electrically coupled to the first plurality of electrical connectors, and the fourth plurality of electrical connectors are capable of being electrically coupled to the second plurality of electrical connectors.

19 Claims, 4 Drawing Sheets

POWER SUPPLIES

BACKGROUND

A computing device, such as a server, may include a power supply to transform power to a usable form for the computing device.

BRIEF DESCRIPTION OF THE DRAWINGS

Certain examples are described in the following detailed description and in reference to the drawings, in which.

DETAILED DESCRIPTION

Power supply density and efficiency increases with each generation of power supply. However, as the density has increased and corresponding size has decreased, fan sizes have not shrunk in size while maintaining cooling to match the increase power supply density. The techniques of this disclosure propose a power supply that allow a reduction in power supply size while maintaining an acceptable power supply fan size.

More particularly, the techniques of this disclosure propose a power supply enclosure comprising at least two power supplies and a fan module that is common to both power supplies. Disposed on the common fan module is a fan to cool both power supplies. A power inlet (e.g. a C13 inlet) is also disposed on the fan module. The fan module electrical connects to the at least two power supplies via electrical connectors disposed on opposite side of the fan module. The electrical connectors are symmetric about an axis of symmetry of the common fan module. In various examples, the common fan module may attach to a single power supply via an electrical connector.

The common fan module may offer flexibility in terms of connectivity options for the power supplies to which the common fan module is attached. As examples, the common fan module may offer two different types of inlets. Additionally, the common fan module may comprise electromagnetic interference (EMI) filtering. In some other examples, the common fan module may comprise hinges that allow the common fan module to pivot or articulate, and may allow one of the power supplies to be removed while the other power supply remains powered.

Figure 1:
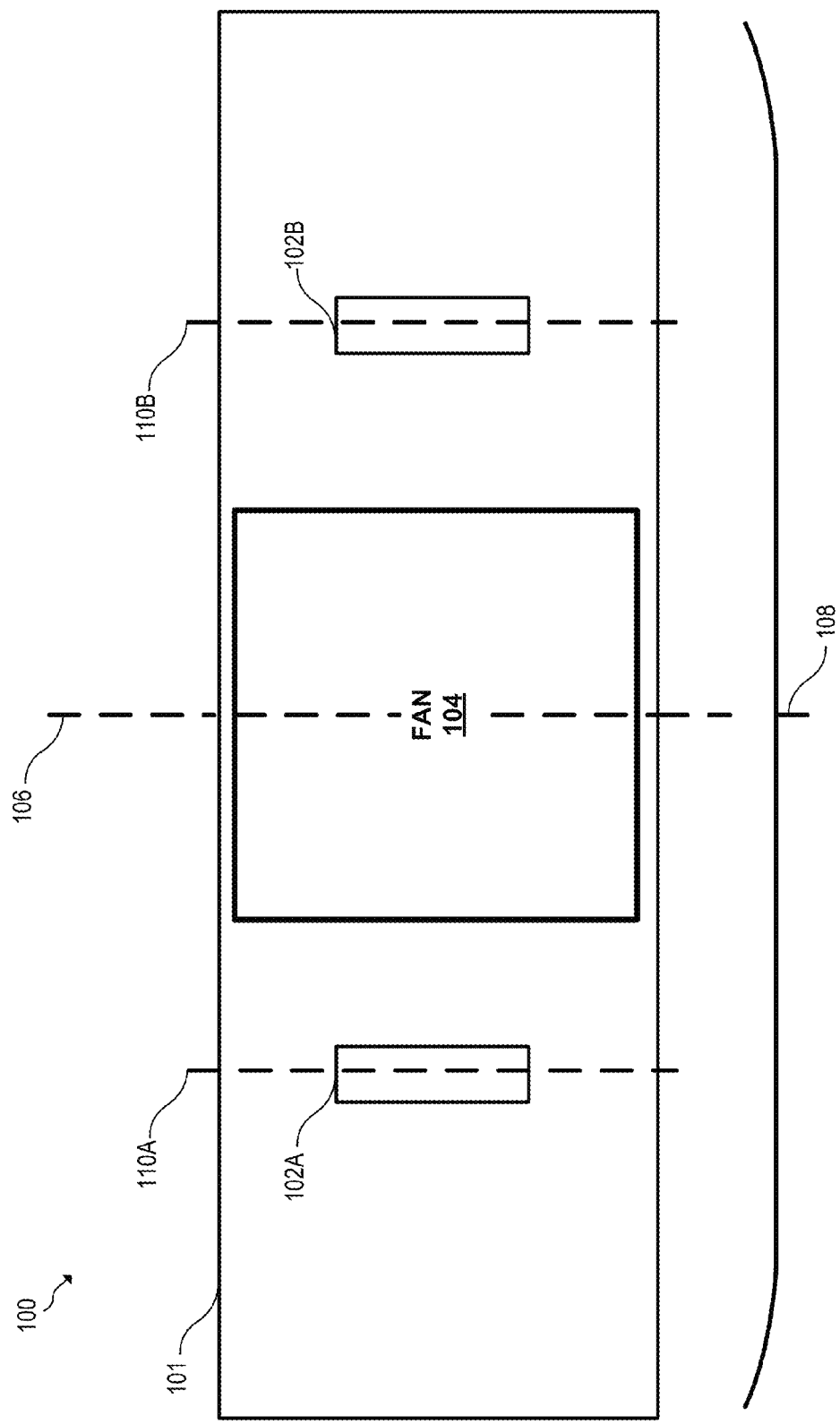
FIG. 1 is a conceptual diagram of a side perspective of an example common fan module.

FIG. 1 is a conceptual diagram of a side perspective of an example common fan module. Common fan module 100 is illustrated in FIG. 1. Common fan module 100 attaches (e.g. snaps on) to at least to a first power supply and a second power supply (not illustrated in FIG. 1, but illustrated in other figures described herein). The first and second power supplies may comprise power supplies of a computing device, such as a server, in various examples. The power supplies may convert power from a one form (e.g. alternating current (AC)) to a usable form for the computing device (e.g. direct current (DC)).

Common fan module 100 comprises a body 101 and a fan 104. Body 101 has a top and bottom edge, as well as a leftmost and rightmost edge. Body 101 comprises a first electrical connector 102A and a second electrical connector 102B (collectively electrical connectors 102.)

First electrical connector 102A connects to a corresponding electrical connector of a first power supply, and second electrical connector 102B connects to a corresponding electrical connector of a second power supply. First electrical connector 102A and second electrical connector 102B provide power from an inlet disposed on common fan module 100 to the power supplies to which common fan module 100 is attached.

Electrical connectors 102 may be positioned symmetrically about an axis of symmetry 106. Axis of symmetry 106 is illustrated as a (vertical) y-axis indicated with a dashed line in FIG. 1, and may be located at a midpoint between the left and right edges of body 101. It should be understood that although electrical connectors 102 are symmetric about axis of symmetry 106, other components, including those components disposed within power supplies, may not be symmetrical.

In various examples, electrical connectors 102A and 102B may be positioned at midpoints 110A and 110B, midpoints 110A and 110B are located at the midpoints between axis of symmetry 106, and the left and right edges, respectively, of body 101. By placing electrical connectors 102 at midpoints 110A and 110B, the corresponding electrical connector on each connected power supply is placed at a midpoint of the power supplies, thereby allowing each power supply to be installed in a computing device in a first orientation or in a second orientation that is rotated 180 degrees relative to the first orientation.

Common fan module 100 may have a width dimension, indicated in FIG. 1 in the x-(horizontal) dimension, indicated by brace 108. The x-dimension of common fan module 100 may be in the range of 8.5-10 centimeters (cm), inclusive.

When common fan module 100 is attached to a power supply enclosure, as illustrated in greater detail herein, fan 104 blows air to cool each of the power supplies to which common fan module 100 is attached. In an example where the computing device to which common fan module 100 is attached comprises a 1U enclosure, fan 104 may comprise a 40 mm (millimeter)×40 mm fan. In examples where the computing device to which common fan module 100 is attached is a 2U+ form factor, fan 104 may comprise a 60 mm×60 mm fan. In some examples, fan 104 may be disposed centrally relative to the top and bottom edges, and/or left and right edges of common fan module 100. That is, fan 104 may be symmetric about axis of symmetry 106. In some examples, there may be a light-emitting diode (LED) corresponding for each power supply to which fan common fan module 100 is electrically coupled. The LED may indicate the status of each power supply.

Figure 2:
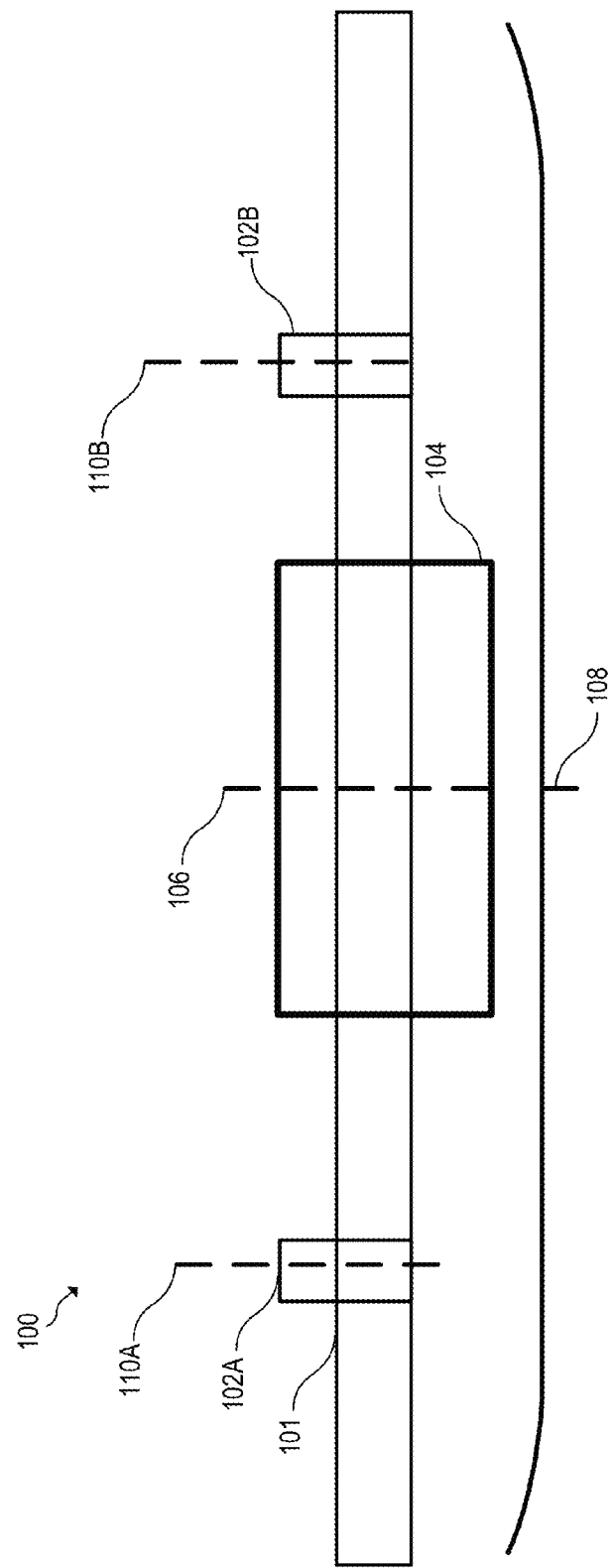
FIG. 2 is a conceptual diagram of an example of a top perspective of a common fan module.

FIG. 2 is a conceptual diagram of an example of a top perspective of a common fan module. As illustrated in FIG. 1, electrical connectors 102 and fan 104 are symmetric about axis of symmetry 106. In various examples, and as illustrated in FIG. 2, electrical connectors 102 are illustrated as protruding from body 101 of common fan module 100. However in various examples, electrical connectors 102 may be flush with or recessed within common body 101.

Fan 104 is also illustrated as protruding from both ends of common fan module 100. However in various examples, electrical connectors 102 may be flush or may only protrude from one side of common fan module 100. In some examples, fan 104 may be mounted on one side of body 101.

As in FIG. 1, first electrical connector 102A is disposed at a midpoint 110A, and second electrical connector 102B is disposed at a second midpoint 1106. Midpoints 110A and 1106 are illustrated with a dashed line. Although electrical connectors 102 may be disposed at midpoints 110 in some examples, in other examples, electrical connectors 102 may be horizontally offset relative to midpoints 110. In such examples a first power supply that is electrically coupled to first electrical connector 102A may be rotated 180 degrees relative to a second power supply that is connected to second electrical connector 102B.

Figure 3:
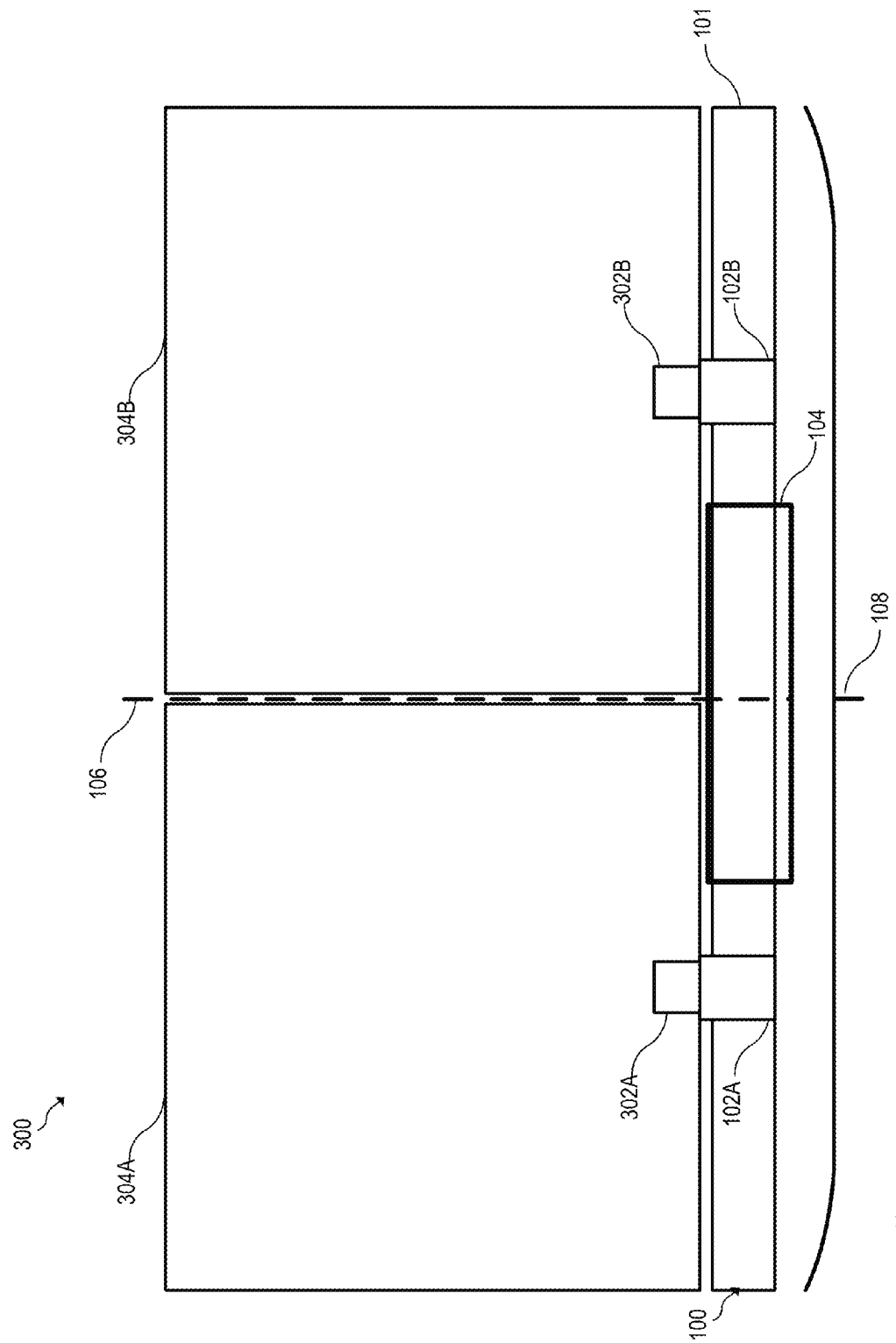
FIG. 3 is another conceptual diagram of a top perspective of an example power supply enclosure.

FIG. 3 is another conceptual diagram of a top perspective of an example power supply enclosure. FIG. 3 illustrates a system comprising power supply enclosure 300. Power supply enclosure 300 comprises a first power supply 304A and a second power supply 304B (collectively power supplies 304). Power supplies 304 are electrically and physically coupled to common fan module 100. In some examples, one of power supplies 304 may comprise a redundant power supply, and may operate in a "1+1" configuration in which the system requires only one active power supply, and the second active power supply is redundant. Two active power supplies provides fault tolerance.

First electrical connector 102A is electrically coupled with an aligned first electrical connector 302A of first power supply 304A. Second electrical connector 102A is electrically coupled with an aligned second electrical connector 302B of second power supply 304B. In some examples, first electrical connector 302A, second electrical connector 302B, first electrical connector 102A, and second electrical connector 102B may be aligned with a midpoint positioned between a left or right edge of power supply 304A or 304B and axis of symmetry 106. In various examples, first electrical connector 302A, second electrical connector 302B, first electrical connector 102A, and second electrical connector 102B may be positioned at a location that is offset from the midpoints. In these examples, first power supply 304A may be rotated 180 degrees relative to second power supply 304B.

In some examples, first electrical connector 302A and second electrical connector 302B may also mechanically fasten common fan module 100 to first power supply 304A and second power supply 304B. In various examples, common fan module 100 may snap onto an enclosure that encloses the power supplies. Common fan module 100 may also snap onto one or more power supplies directly.

First electrical connector 302A and second electrical connector 302B may also be symmetric about axis of symmetry 106. Axis of symmetry 106 may be positioned at a midpoint between first power supply 304A and second power supply 304B. First electrical connector 302A and second electrical connector 302B are illustrated as being smaller than electrical connectors 102 for the purposes of illustration. First and second electrical connectors 302 may be larger, smaller, or the same size as electrical connectors 102. Additionally, it should be noted that electrical connectors 102, and connectors 302 may be male connectors, female connectors, or a combination thereof.

Figure 4:
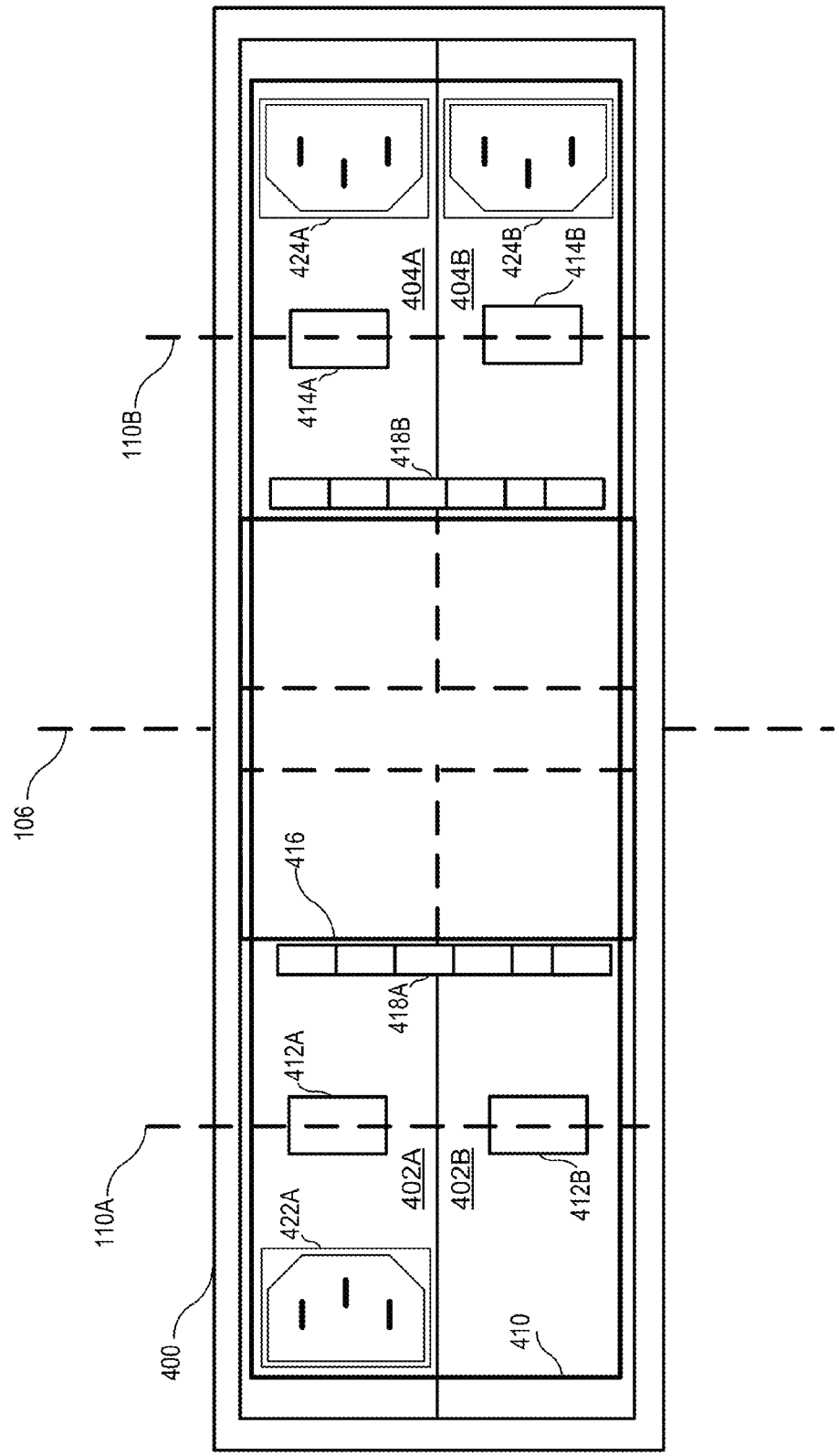
FIG. 4 is a conceptual diagram of a side perspective of an example power supply enclosure.

FIG. 4 is a conceptual diagram of a side perspective of another example power supply enclosure. FIG. 4 illustrates a system comprising a first plurality of power supplies 402A and 402B (power supplies 402), and a second plurality of power supplies 404A and 404B (power supplies 404). In the view illustrated in FIG. 4, power supplies 402, 404 are positioned behind common fan module 410, and within enclosure 400. The portions of power supplies 402, 404 that are obscured by fan 416 are illustrated with dashed lines.

Power supplies 402 and 404 are illustrated as two power supplies for the purpose of illustration. Additional or fewer power supplies may be present. Power supplies 402A, 402B, 404A, and 404B may have a same power rating or different power ratings in various examples. First plurality of power supplies 402 may be aligned vertically and horizontally. Similarly, second plurality of power supplies 404 may be aligned horizontally and vertically in some examples.

Attached to power supplies 402, 404 is a common fan module 410 comprising a fan 416. In some examples, fan 416 may comprise a 60 mm×60 mm fan. Fan 416 cools first plurality of power supplies 402A and 402B and second plurality of power supplies 404A and 404B. In some examples, fan 416 may comprise a dual rotor fan. In various examples, fan 416 may operate in a reverse flow operation in which fan 416 blows air out of a computing device to which fan 416 is coupled.

Common fan module 410 also comprises first plurality of electrical connectors 412A and 412B (first plurality of electrical connectors 412) and second plurality of electrical connectors 414A and 414B (second plurality of electrical connectors 414). In some examples, fan 416 may be symmetric about axis of symmetry 106. Axis of symmetry 106 may be located at a midpoint between first plurality of power supplies 402 and second plurality of power supplies 404. In some examples, first plurality of electrical connectors 412 may be symmetric with second plurality of electrical connectors 414 about axis of symmetry 106.

In some examples, electrical connectors 412 may be positioned at a midpoint 110A. Midpoint 110A may be located at a midpoint between axis of symmetry 106 and a leftmost edge of common fan module 410. In some examples, electrical connectors 414 may be positioned at midpoint 1106, which is located at a midpoint between axis of symmetry 106 and a rightmost edge of common fan module 110.

In other examples, electrical connectors 412 and 414 may be positioned at a horizontal offset relative to midpoints 110A and 1106, respectively. In such cases, power supplies 402A, 402B, may be rotated 180 degrees relative to power supplies 404A and 404B so that electrical connectors 412, 414 are equidistant from axis of symmetry 106.

First plurality of electrical connectors 412 couple with a plurality of electrical connectors of power supplies 402, and second plurality of electrical connectors 412 electrically couple with an aligned plurality of electrical connectors of power supplies 404.

In some examples, common fan module 410 may comprise a first set of hinges 418A and a second set of hinges 4186. Hinges 418A and 4186 may allow fan 416 to pivot or articulate. Hinges 418A and 418B may allow an operator of the computing device to which power supply enclosure 400 is attached to remove one or more of power supplies 402 or 404. While one or more power supplies are being removed, other power supplies may continue to provide power to the computing device. In various examples, one or more of power supplies 402 and/or 404 may comprise a hot-pluggable and/or redundant power supply.

Common fan module 410 also comprises a first inlet 422A that corresponds to first plurality of power supplies 402. Although power supplies 402 are illustrated as having a single corresponding inlet, any number of corresponding inlets (e.g. a plurality of inlets) may be present. Common fan module 410 also comprises a plurality of inlets 424A and 424B (plurality of inlets 424). Inlet 422A may connect electrically with electrical connector 412A and/or 412B. Inlet 424A may connect electrically to electrical connector 414A, and inlet 424B may connect electrically to electrical connector 414B.

In various examples inlet 422A and/or plurality of inlets 424 may comprise one or more of: a C13 inlet, a C14 inlet, a 3-phase connection, or a direct current (DC) inlet. In some examples, each of inlets 422A, 424A, 424B may be of a same inlet type or of a combination of different inlet types.

Common fan module 410 may also comprise electromagnetic (EMI) filtering components in lieu of an inlet. In the example of FIG. 4, power supply 402B is illustrated as having no corresponding inlet. EMI filtering components may be disposed in a location where an inlet may be disposed. In such examples where a power supply lacks a corresponding inlet on common fan module 410, one inlet may provide two or more electrical connections. For example, inlet 422A may be coupled to electrical connector 412A and 412B and to the electrical filtering components. In where one inlet provides power to a plurality of power supplies, an automatic transfer switch may be present on common fan module 410. The automatic transfer switch may switch to a redundant power source in the event of a power source fault.

The invention claimed is:

1. A device comprising a power supply enclosure for a rack-mountable computing device, the power supply enclosure comprising:
   a first power supply comprising a first electrical connector;
   a second power supply comprising an electrical second connector,
   wherein the first electrical connector and the second electrical connector are symmetric about an axis of symmetry; and
   a common fan module, the common fan module comprising:
      a fan to cool the first power supply and the second power supply;
      a third electrical connector that electrically couples with the first electrical connector and is aligned with the first electrical connector;
      a fourth electrical connector that electrically couples with the second electrical connector and is aligned with the second electrical connector;
      a power inlet coupled to at least one of the third electrical connector or the fourth electrical connector,
   wherein the common fan module is mounted to a set of hinges to allow the fan to articulate and to allow at least one of the first power supply or the second power supply to be removed while maintaining an electrical connection with an other one of the first power supply or the second power supply.

2. The device of claim 1, wherein the fan comprises a 40 mm×40 mm fan.

3. The device of claim 1, wherein the axis of symmetry is located at a midpoint between the first power supply and the second power supply,
   wherein the common fan module is symmetric about the axis of symmetry, and
   wherein the first electrical connector and the third electrical connector are disposed at a midpoint between the axis of symmetry and a leftmost edge of the common fan module, and
   wherein the second electrical connector and the fourth electrical connector are disposed at a midpoint between the axis of symmetry and a rightmost edge of the common fan module.

4. The device of claim 1, comprising:
   a third power supply and a fourth power supply,
   wherein the third power supply is mounted in parallel with the first power supply, and the fourth power supply is mounted in parallel with the second power supply,
   wherein the first and third power supplies are symmetric with the second and fourth power supplies, and
   wherein the common fan module is common among the first, second, third, and fourth power supplies, and
   wherein the fan to cool the first, second, third, and fourth power supplies.

5. The device of claim 1, wherein the common fan module comprises an automatic transfer switch.

6. The device of claim 1, the common fan module comprising electromagnetic interference (EMI) filtering components.

7. The device of claim 1, wherein the common fan module comprises at least one of:
   A C13 inlet, a C14 inlet, a 3-phase connection, or a DC inlet.

8. The device of claim 1, wherein the fan comprises at least one of:
   a dual rotor fan or a fan to operate in a reverse flow configuration.

9. The device of claim 1, wherein the second power supply is a redundant power supply.

10. The device of claim 1, wherein the power supply to fit in a 1U server chassis.

11. The device of claim 1, wherein a width of the device is in the range of 8.5 centimeters (cm) to 10 cm, inclusive.

12. The device of claim 1, wherein the first power supply and the second power supply have different power ratings.

13. A system comprising:
   a first plurality of power supplies comprising a first plurality of electrical connectors;
   a second plurality of power supplies comprising a second plurality of electrical connectors,
   wherein the first plurality of electrical connectors and the second plurality of external electrical connectors are symmetric with the second plurality of power supply about an axis of symmetry, the axis of symmetry located at a midpoint between the first plurality of power supplies and the second plurality of power supplies; and
   a common fan module comprising:
      a fan to cool the first plurality of power supplies and the second plurality of power supplies;
      a power inlet;
      a third plurality of electrical connectors; and
      a fourth plurality of electrical connectors,
      wherein the third plurality of electrical connectors are capable of being electrically coupled to the first plurality of electrical connectors, and
      wherein the fourth plurality of electrical connectors are capable of being electrically coupled to the second plurality of electrical connectors,
   wherein the common fan module is mounted to a set of hinges to allow the fan to articulate and to allow at least one of the first power supply or the second power supply to be removed while maintaining an electrical connection with an other one of the first power supply or the second power supply.

14. The device of claim 13, wherein the fan comprises a 60 mm×60 mm fan.

15. The device of claim 14, wherein the power inlet comprises at least one of:
   a C13 inlet, a C14 inlet, a 3-phase connection, or a DC inlet.

16. The device of claim 13, wherein the power supply fits in a 2U server chassis.

17. The device of claim 13, wherein at least one power supply of first plurality of power supplies or the second plurality of power supplies is a redundant power supply.

18. A device comprising:
- a common fan module capable of being connected to a first power supply and a second power supply, the common fan module comprising:
- a first electrical connector capable of being electrically coupled to the first power supply;
- a second electrical connector capable of being electrically coupled to the second power supply; and
- a fan centrally disposed in the common fan module, the fan to cool the first power supply and the second power supply,
- wherein the common fan module is mounted to a set of hinges to allow the fan to articulate and to allow at least one of the first power supply or the second power supply to be removed while maintaining an electrical connection with an other one of the first power supply or the second power supply.

19. The device of claim 18,
wherein the first electrical connector is positioned symmetrically with the second electrical connector.

* * * * *